(12) United States Patent
Iwamoto (10) Patent No.: US 11,309,883 B2
(45) Date of Patent: Apr. 19, 2022

(54) SEMICONDUCTOR MODULE (71) Applicant: FUJI ELECTRIC CO., LTD., Kawasaki (JP)

(72) Inventor: Susumu Iwamoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/357,576

(22) Filed: Jun. 24, 2021

(65) Prior Publication Data

US 2022/0069816 A1 Mar. 3, 2022

(30) Foreign Application Priority Data

Aug. 26, 2020 (JP) .............................. JP2020-142500

(51) Int. Cl.
| | |
|---|---|
| H03K 17/687 | (2006.01) |
| H03K 17/14 | (2006.01) |
| H01L 23/58 | (2006.01) |
| H01L 29/861 | (2006.01) |
| H01L 29/78 | (2006.01) |
| H03K 17/567 | (2006.01) |
| H01L 29/739 | (2006.01) |

(52) U.S. Cl.
CPC ........... *H03K 17/145* (2013.01); *H01L 23/58* (2013.01); *H01L 29/7393* (2013.01); *H01L 29/7818* (2013.01); *H01L 29/861* (2013.01); *H03K 17/567* (2013.01)

(58) Field of Classification Search
CPC .... H03K 17/145; H03K 17/567; H01L 23/58; H01L 29/7393; H01L 29/7818; H01L 29/861
See application file for complete search history.

(56) References Cited

U.S. PATENT DOCUMENTS

2015/0364468 A1* 12/2015 Kiep ................... H01L 27/0629 257/139
2019/0204251 A1* 7/2019 Nakano ................ H01L 27/04

FOREIGN PATENT DOCUMENTS

| JP | H05-18127 U | 3/1993 |
|---|---|---|
| JP | 2002-119044 A | 4/2002 |
| JP | 2003-188336 A | 7/2003 |
| JP | 2005-228851 A | 8/2005 |
| JP | 2008-042317 A | 2/2008 |
| JP | 2019-192690 A | 10/2019 |

* cited by examiner

*Primary Examiner* — Metasebia T Retebo
(74) *Attorney, Agent, or Firm* — Rabin & Berdo, P.C.

(57) ABSTRACT

A semiconductor module, including a semiconductor chip that includes a switching device having a control electrode, and a control terminal connected to the control electrode, a first resistance being formed between the control electrode and the control terminal and having a positive temperature coefficient, and a second resistance connected to the control terminal, the second resistance having a negative temperature coefficient. A temperature coefficient of a combined resistance at the control terminal is zero or negative.

12 Claims, 7 Drawing Sheets

SEMICONDUCTOR MODULE

CROSS-REFERENCE TO RELATED APPLICATION

The present application claims priority pursuant to 35 U.S.C. § 119 from Japanese patent application number 2020-142500 filed on Aug. 26, 2020, the entire disclosure of which is hereby incorporated by reference herein.

BACKGROUND

Technical Field

The present disclosure relates to a semiconductor module.

Description of the Related Art

In semiconductor switching devices, there are known configurations for avoiding switching characteristics from being affected by ambient temperature as much as possible. For example, Japanese Unexamined Utility Model Application Publication No. H5-18127 discloses a semiconductor switching device that uses a temperature-dependent resistive element with a negative temperature coefficient as a gate resistance.

According to such a configuration, even if ambient temperature rises, the resistance value of the gate resistance can be reduced in accordance with a rise in the temperature.

However, in the case of the technique disclosed in Japanese Unexamined Utility Model Application Publication No. H5-18127, the temperature coefficient of an external resistance of a semiconductor switching device is selected to be negative. However, the temperature coefficient of an internal resistance is not considered from the gate electrode of the semiconductor switching device itself to a terminal to which an external resistance is connected. Accordingly, even if the temperature coefficient of the external resistance is set to be negative, the substantial gate resistance of the semiconductor switching device (combined resistance of the internal resistance and the external resistance) may results in being positive, due to the temperature coefficient of the internal resistance. Then, in such a case, the switching loss of the semiconductor switching device increases.

The present disclosure is directed to provision of a semiconductor module capable of reducing the switching loss of a semiconductor switching device.

SUMMARY

An aspect of the present disclosure is a semiconductor module comprising: a semiconductor chip that includes a switching device having a control electrode, and a control terminal connected to the control electrode, a first resistance being formed between the control electrode and the control terminal, the first resistance having a positive temperature coefficient; and a second resistance connected to the control terminal, the second resistance having a negative temperature coefficient, wherein a temperature coefficient of a combined resistance at the control terminal is zero or negative.

DETAILED DESCRIPTION

At least following matters will become apparent from the descriptions of the present specification and the accompanying drawings.

First Embodiment

<Configuration of Semiconductor Module>

Figure 1:
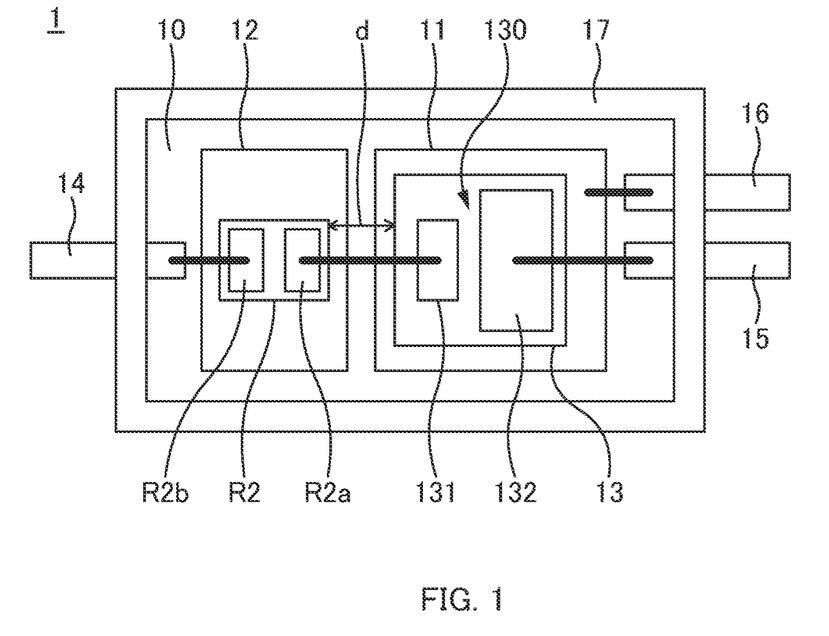
FIG. 1 is a diagram illustrating one example of a configuration of a semiconductor module 1.

FIG. 1 is a diagram illustrating one example of a configuration of a semiconductor module 1 according to an embodiment of the present disclosure. The semiconductor module 1 comprises an insulating plate 10, a first conductive pattern 11, a second conductive pattern 12, a semiconductor chip 13, a second resistance R2, a first terminal 14, a second terminal 15, a third terminal 16, and a housing 17.

The insulating plate 10 is made of, for example, ceramics, resin, or the like. The first conductive pattern 11 and the second conductive pattern 12 are formed in a surface of the insulating plate 10, and are rectangular patterns made of, for example, copper, aluminum, or alloys containing these.

On the first conductive pattern 11, the semiconductor chip 13 is mounted. On the second conductive pattern 12, at least the second resistance R2 is mounted. Here, the semiconductor chip 13 in which a first resistance R1 described later is formed and the second resistance R2 are spaced apart from each other by a predetermined distance d.

The semiconductor chip 13 is mounted on the first conductive pattern 11. The semiconductor chip 13 is a chip using a Si substrate, a SiC substrate, or a GaN substrate. In an embodiment of the present disclosure, the semiconductor chip 13 is a chip using a Si substrate. The semiconductor chip 13 is mounted to the switching device 130.

The switching device 130 is an insulated gate bipolar transistor (IGBT), a metal-oxide-semiconductor (MOS) transistor, or a bipolar transistor. In an embodiment of the present disclosure, an n-MOS transistor is used as the switching device 130.

A gate terminal 131 and a source terminal 132 of the switching device 130 are mounted in the front surface of the semiconductor chip 13. A drain terminal of the switching device 130 is mounted in the back surface of the semiconductor chip (not illustrated). The gate terminal 131, the source terminal 132, and the drain terminal of the semiconductor chip 13 are connected respectively to a gate electrode GE, a source electrode SE, and a drain electrode DE of the switching device 130, which is a metal-oxide-semiconductor field-effect transistor (MOSFET).

Note that, as described above, the switching device 130 is a MOSFET in an embodiment of the present disclosure. However, in the case where the switching device 130 is an IGBT, the "source" and the "drain" in an embodiment of the present disclosure correspond to an "emitter" and a "collector", respectively. Further, in the case where the switching device 130 is a bipolar transistor, the "gate", the "source", and the "drain" in an embodiment of the present disclosure correspond to a "base", an "emitter", and a "collector", respectively.

In addition, the "gate terminal", the "source terminal", and the "drain terminal" in an embodiment of the present disclosure correspond to a "control terminal", a "ground-side terminal", and a "power-supply-side terminal", respectively. The "gate electrode", the "source electrode", and the "drain electrode" in an embodiment of the present disclosure correspond to a "control electrode", a "ground-side electrode", and a "power-supply-side electrode", respectively.

Note that, in an embodiment of the present disclosure, the MOSFET including a parasitic diode as the switching device 130 is used, however, in the case where a device (e.g., IGBT) including no parasitic diode is used, the switching device 130 only needs be connected to a free-wheeling diode.

Note that, although details will be described later, a resistance (hereinafter, referred to as the "first resistance R1") with a positive temperature coefficient is formed between the gate electrode GE and the gate terminal 131. In other words, the resistance value of the first resistance R1 increases with a rise in temperature. The first resistance R1 is an embedded resistance formed in the semiconductor chip 13. In order to form the first resistance R1 with a positive temperature coefficient, the semiconductor chip 13 comprises resistance wiring to connect the gate electrode GE and the gate terminal 131. Examples of materials of such resistance wiring can include metal, polycrystalline silicon, or the like.

The second resistance R2 is mounted on the second conductive pattern 12. The second resistance R2 has one end R2a thereof connected to the gate terminal 131 of the semiconductor chip 13 via a wiring member, and the other end R2b thereof connected to the first terminal 14 via a wiring member. The wiring member only needs to be made of a conductive material, and can use, for example, a wire or lead frame containing aluminum and/or copper. Note that "connection" in the following explanation refers to electrical connection, where connection may be established via a diode and/or a resistance.

The second resistance R2 has a negative temperature coefficient. In other words, the resistance value of the second resistance R2 decreases with a rise in temperature. Examples of materials of the second resistance R2 with a negative temperature coefficient can include ceramics.

The first terminal 14 has one end thereof connected to the second resistance R2 on the other end R2b side via the wiring member inside the housing 17. The first terminal 14 has the other end thereof extending from the outside of the housing 17. The other end of the first terminal 14 is connected to an external driver device not illustrated. The second terminal 15 has one end thereof connected to the source terminal 132 of the switching device 130 via the wiring member inside the housing 17. The second terminal 15 has the other end thereof extending from the outside of the housing 17. The other end of the second terminal 15 is connected to an external driver device not illustrated. The third terminal 16 has one end thereof connected to the first conductive pattern 11 via the wiring member inside the housing 17. The first conductive pattern 11 is coupled to the drain terminal of the switching device 130 via a joining member such as solder and/or the like. The third terminal 16 has the other end thereof extending from the outside of the housing 17. The other end of the third terminal 16 is connected to an external device not illustrated.

The housing 17 is made of resin and/or the like, and houses the insulating plate 10, the first conductive pattern 11, the second conductive pattern 12, the semiconductor chip 13, and the second resistance R2. The housing 17 according to an embodiment of the present disclosure is a substantially rectangular box-shaped member having an opening in a front surface thereof in the top view illustrated in FIG. 1. In the housing 17 according to an embodiment of the present disclosure, the first terminal 14 extends from one side surface of the housing 17. In addition, in the housing 17, the second terminal 15 and the third terminal 16 extend from the other side surface on the side opposite to the above-described one side surface.

<Temperature Characteristics of Resistances>

Here, the temperature characteristics of the first resistance R1, the second resistance R2, and a resistance connected to the gate terminal 131 will be described. Note that the "resistance connected to the gate terminal 131" means the resistance between the gate electrode GE and the first terminal 14, and hereinafter, referred to as a "combined resistance". In the semiconductor module 1 in FIG. 1, the combined resistance is a combined resistance of the first resistance R1 and the second resistance R2 connected in series.

Figure 2:
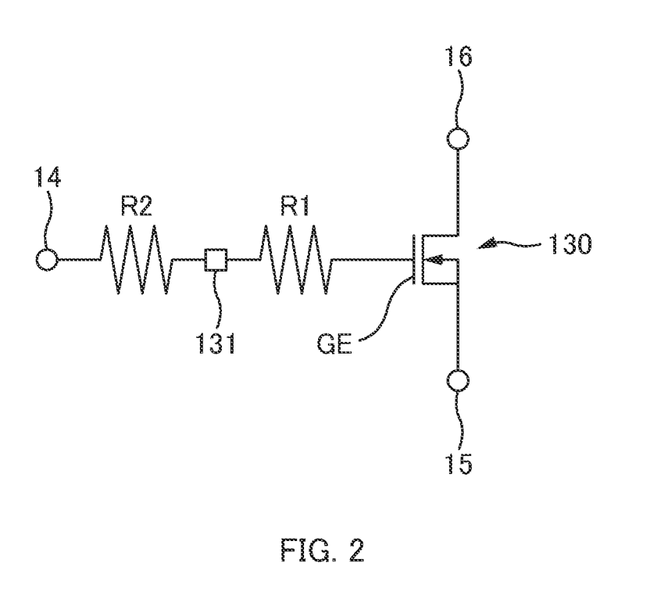
FIG. 2 is a diagram illustrating an equivalent circuit of a semiconductor module 1.

FIG. 2 is a diagram illustrating an equivalent circuit of the semiconductor module 1. The first resistance R1 and the second resistance R2 are connected in series. In other words, the combined resistance of the first resistance R1 and the second resistance R2 is the sum of the resistance values of the first resistance R1 and the second resistance R2.

Figure 3:
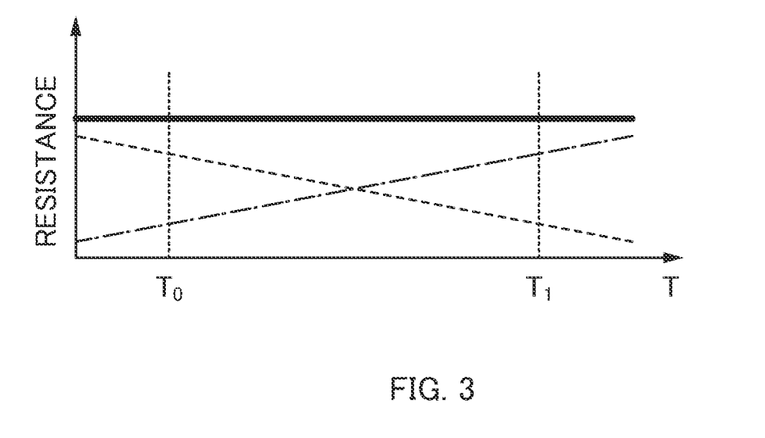
FIG. 3 is a conceptual diagram explaining the temperature characteristics of a first resistance, a second resistance, and a combined resistance.
Figure 4:
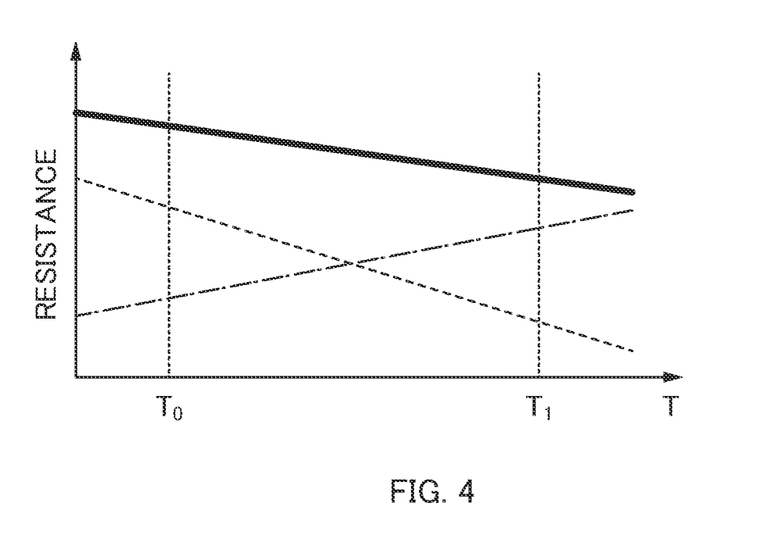
FIG. 4 is a conceptual diagram explaining the temperature characteristics of a first resistance, a second resistance, and a combined resistance.

FIGS. 3 and 4 are conceptual diagrams explaining two different aspects of the temperature characteristics of the first resistance R1, the second resistance R2, and the combined resistance. In both of FIGS. 3 and 4, a dotted dashed line indicates the temperature characteristics of the first resistance R1, a dashed line indicates the temperature characteristics of the second resistance R2, and a solid line indicates the temperature characteristics of the combined resistance.

In an embodiment of the present disclosure, the temperature coefficient of the combined resistance of the first resistance R1 and the second resistance R2 is designed to be zero or negative. In other words, the resistance value of the combined resistance is constant or decreases with a rise in temperature. Alternatively, the temperature coefficient of the combined resistance may be zero or negative at least within the operating range of the semiconductor module 1. In an embodiment of the present disclosure, the operating range is a range from a temperature $T_0$ to a temperature $T_1$. The temperature $T_0$ can be a value (e.g., −40° C.) set in accordance with the specifications of the semiconductor module 1. The temperature $T_1$ can be the maximum junction temperature (e.g., 175° C.). Note that, in FIGS. 3 and 4, the temperature characteristics of the first resistance R1, the second resistance R2, and the combined resistance are simply given by straight lines, but the present disclosure is not limited thereto. Each of the temperature characteristics may be a curved line. In other words, in the operating range, the temperature coefficient of the combined resistance may vary in the range of zero or negative according to the temperature, as long as it is zero or negative.

FIG. 3 gives an aspect in which the temperature coefficient of the combined resistance is 0, and the combined resistance is invariant to temperature changes. FIG. 4 gives an aspect in which the temperature coefficient of the combined resistance is negative, and the combined resistance decreases with a rise in temperature.

<Switching Characteristics>

Figure 5:
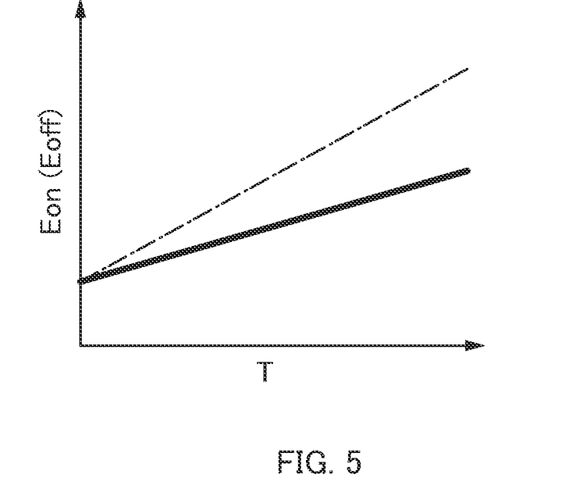
FIG. 5 is a conceptual diagram explaining the relationship between a temperature and a switching loss upon turning on of a switching device.
Figure 6:
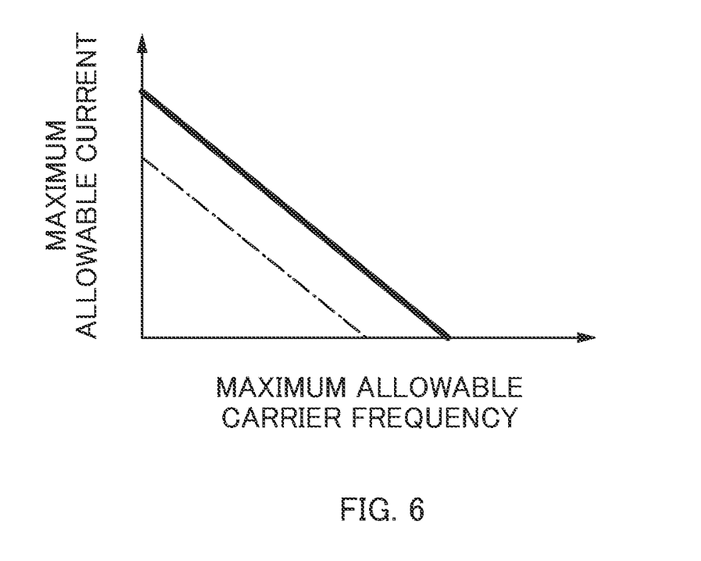
FIG. 6 is a conceptual diagram explaining the relationship between a maximum allowable current and a maximum allowable carrier frequency of a switching device.

Here, the switching characteristics of the switching device 130 in the semiconductor module 1 will be described. FIG. 5 is a conceptual diagram explaining the relationship between a temperature and a switching loss upon turning on of the switching device 130. FIG. 6 is a conceptual diagram explaining the relationship between the maximum allowable current and the maximum allowable carrier frequency of the switching device 130. In both FIGS. 5 and 6, a solid line indicates the semiconductor module 1 according to an embodiment of the present disclosure, a dotted dashed line indicates a semiconductor module in which the combined resistance has a positive temperature coefficient.

As illustrated in FIG. 5, the combined resistance of the semiconductor module has a positive temperature coefficient, and thus the resistance value increases with a rise in temperature. On the other hand, the combined resistance of the semiconductor module 1 has a temperature coefficient that is equal to zero or negative, and thus the resistance value decreases with a rise in temperature. Accordingly, the semiconductor module 1 can reduce an increase in switching loss associated with a rise in temperature, during on-time, as compared with the semiconductor module. Note that FIG. 5 explains the switching loss upon turning on of the switching device 130, and the same applies to the case of turning off, for example.

Furthermore, in the semiconductor module 1, the upper temperature limit of the specifications is higher than that in the semiconductor module. Accordingly, as illustrated in FIG. 6, both the maximum allowable carrier frequency and the maximum allowable current of the semiconductor module 1 can be set higher than those of the semiconductor module. Here, the "maximum allowable carrier frequency" indicates the maximum frequency at which the switching device 130 can be turned on and off. Further, the "maximum allowable current" indicates the maximum current that can be passed from the source electrode to the drain electrode in the rated junction temperature range of the switching device 130.

In addition, the semiconductor module 1 according to an embodiment of the present disclosure can mitigate oscillation phenomenon that is likely to occur in an operation at a relatively low temperature such as the start of the operation, a low current operation, and/or the like, and on top of that, the semiconductor module 1 can reduce a loss in a steady operation at a high current that is likely to result in a large loss.

<Layouts of Conductive Patterns>

Here, the layouts of the first conductive pattern 11 and the second conductive pattern 12 will be described. As described above, the semiconductor chip 13 in which the first resistance R1 is formed and the second resistance R2 are spaced apart from each other by the predetermined distance d.

The following will describe, in detail, setting of an interval between the first conductive pattern 11 and the second conductive pattern 12. The interval between the first conductive pattern 11 and the second conductive pattern 12 is set based on respective temperature changes of the first resistance R1 and the second resistance R2 during the operation of a semiconductor device using the semiconductor module 1.

Figure 7:
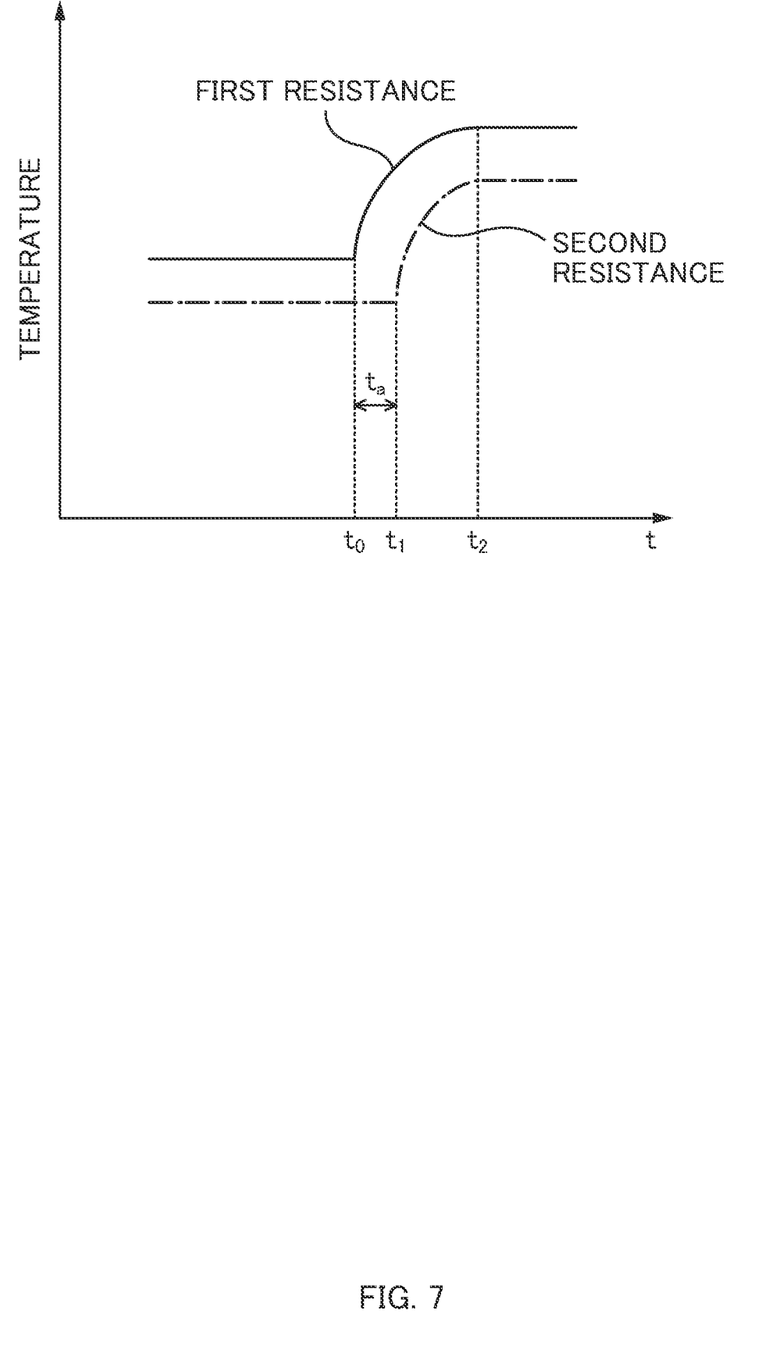
FIG. 7 is a diagram illustrating one example of respective temperature changes in a first resistance and a second resistance.

FIG. 7 is a diagram illustrating one example of respective temperature changes of the first resistance R1 and the second resistance R2 with respect to the operation time of the semiconductor module 1. Note that, here, an explanation will be given using an example of the case where the semiconductor module 1 drives a load (not illustrated) based on a PWM signal inputted to the first terminal 14.

In FIG. 7, before time $t_0$, the semiconductor module 1 is in a steady operation based on the PWM signal having a predetermined duty cycle (e.g., 50%), and the first resistance R1 and the second resistance R2 each has a constant temperature. The temperature of the first resistance R1 is higher than the temperature of the second resistance R2 due to the heat generated by the switching device 130. Time $t_0$ is the time of the transition of the operation state of the semiconductor module 1. Specifically, it is a timing at which the duty cycle (e.g., 60%) of the PWM signal increases such that power to the load increases. In association with the transition of the operation state of the semiconductor module 1 as such, the heat generated by the switching device 130 increases, and the temperature of the first resistance R1 (temperature of the semiconductor chip 13) start to rise.

Then, the heat from the switching device 130 is diffused. Time $t_1$ is the time at which the temperature of the second resistance R2 start to rise due to the heat diffused from the switching device 130 reaching the second resistance R2. With the semiconductor chip 13 in which the first resistance R1 is formed and the second resistance R2 being spaced apart from each other by the predetermined distance d, the start of the temperature rise of the second resistance R2 is delayed by a predetermined time period $t_a$ from the start of the temperature rise of the first resistance R1.

Thereafter, at time $t_2$, each of the temperatures of the first conductive pattern 11 and the second conductive pattern 12 becomes constant in the semiconductor module 1. At this time as well, the temperature of the first resistance R1 is higher than the temperature of the second resistance R2 due to the heat generated by the switching device 130.

Incidentally, the temperature of the first conductive pattern 11 to which the semiconductor chip 13 is mounted may rise, for example, if the load transitionally enters light load condition, even in the case where the duty cycle of the PWM signal does not change. Then, in an embodiment of the present disclosure, the second resistance R2 is spaced apart from the semiconductor chip 13 in which the first resistance R1 is formed by the predetermined distance d, such that the temperature of the second resistance R2 rises after the predetermined time period $t_a$ has elapsed since the temperature of the semiconductor chip 13 starts to rise.

Accordingly, in such a case, the temperature of only the first resistance R1 rises during the predetermined time period $t_a$ from time $t_0$, substantially without change in the temperature of the second resistance R2. Thus, the resistance value of the combined resistance increases, thereby being able to reduce the speed of turning on and turning off of the switching device 130.

In the semiconductor module, there is a case where an oscillation phenomenon occurs upon transition of the operation state and/or a sudden change of the load condition to the light load condition. In an embodiment of the present disclosure, even in such a case, the resistance value of the combined resistance increases, thereby being able to mitigate the oscillation phenomenon.

Note that, here, the predetermined time period $t_a$ may be, for example, 1 second or more and 120 seconds or less. This is because if the predetermined time period $t_a$ is too short, the oscillation phenomenon cannot be mitigated, and it is too long, the loss increases. Accordingly, the predetermined distance d may be, for example, 0.5 mm or more and 60 mm or less. Further, in order to satisfy that the temperature of the second resistance R2 substantially does not change, it only needs to be satisfied, for example, that the temperature rise of the second resistance R2 is within 10% of the rise in the temperature of the semiconductor chip 13. With the temperature rise thereof being within 10%, the increase in the first resistance R1 becomes dominant, thereby being able to obtain effects such as mitigation of the oscillation phenomenon and the like.

Second Embodiment

Figure 8:
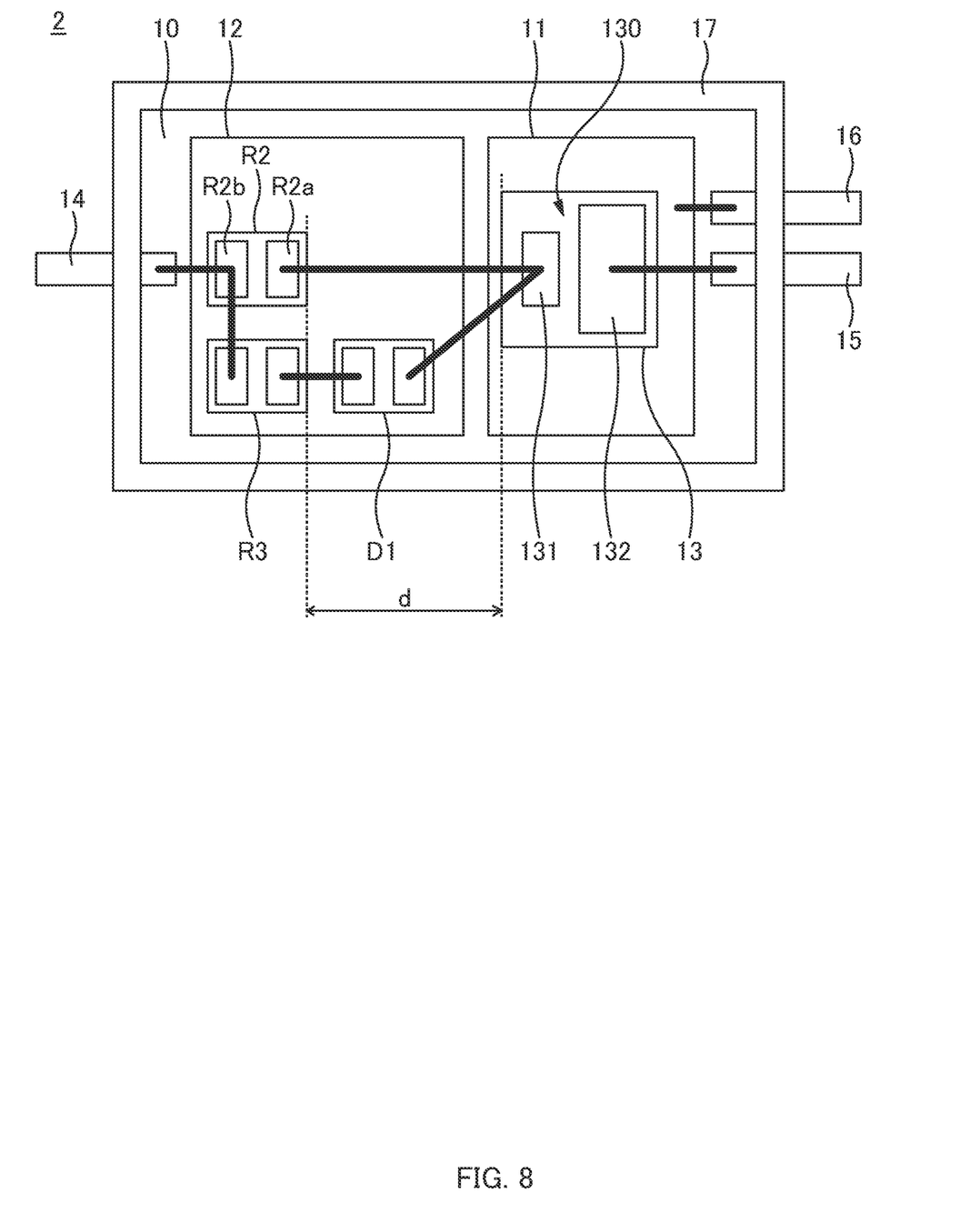
FIG. 8 is a diagram illustrating one example of a configuration of a semiconductor module 2.
Figure 9:
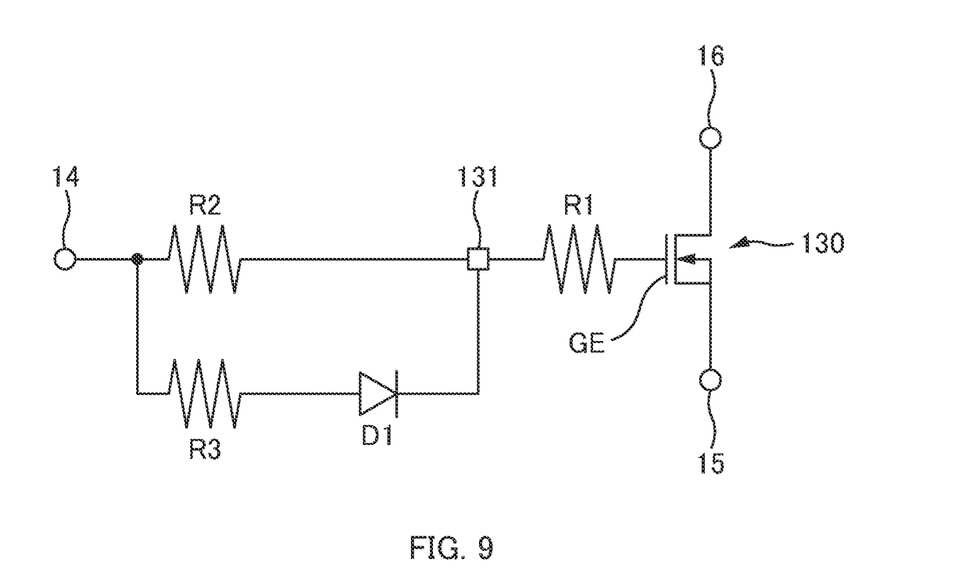
FIG. 9 is a diagram illustrating an equivalent circuit of a semiconductor module 2.

FIG. 8 is a diagram illustrating one example of a configuration of a semiconductor module 2 according to an embodiment of the present disclosure. FIG. 9 is a diagram illustrating an equivalent circuit of the semiconductor module 2. The semiconductor module 2 is different from the semiconductor module 1 according to the first embodiment, in further comprising a third resistance R3 and a first diode D1. Note that, in FIGS. 8 and 9, the reference numerals of elements and the like other than the third resistance R3 and the first diode D1 are the same as those in FIGS. 1 and 2.

The third resistance R3 is mounted on the second conductive pattern 12. The third resistance R3 is mounted between the gate terminal 131 connected with the one end R2a of the second resistance R2 and the first terminal 14 connected with the other end R2b of the second resistance R2, and is connected in parallel with the second resistance R2. The semiconductor chip 13 in which the first resistance R1 is formed and the second and third resistances R2 and R3 are spaced apart from each other by the predetermined distance d.

The third resistance R3 has a negative temperature coefficient. Examples of materials of the third resistance R3 with a negative temperature coefficient can include ceramics, similarly to the second resistance R2.

The first diode D1 is mounted on the second conductive pattern 12. The first diode D1 is mounted between the gate terminal 131 connected with the one end R2a of the second resistance R2 and the first terminal 14 connected with the other end R2b of the second resistance R2, and is connected in series with the third resistance R3. In an embodiment of the present disclosure, the first diode D1 has a cathode thereof connected to the gate terminal 131 side, and an anode thereof connected to the first terminal 14 side. More specifically, the gate terminal 131, the first diode D1, the third resistance R3, and the first terminal 14 are connected in this order.

This reduces the combined resistance upon turning on to be smaller than the combined resistance upon turning off, thereby being able to increase the switching speed upon turning on. In addition, even if the resistance values of the second resistance R2 and the third resistance R3 decrease with a rise in temperature, no current flows through the second resistance R2 upon turning off, thereby being able to reduce a surge voltage upon turning off.

Figure 10:
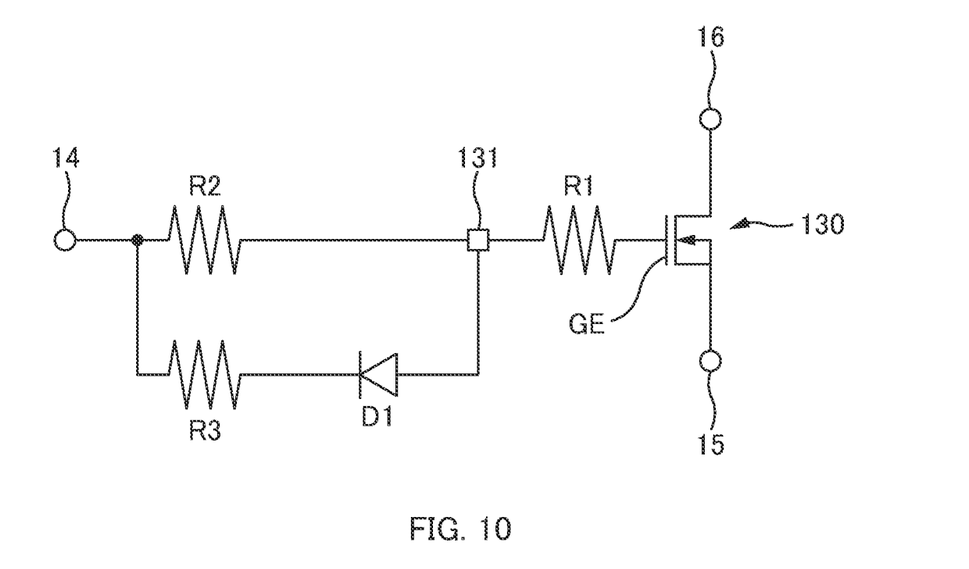
FIG. 10 is a diagram illustrating a modified example of a configuration of a semiconductor module 2.

Note that, as a modified example, the connection relationship between the anode and the cathode of the first diode D1 may be reversed with respect to that in the semiconductor module 2 according to an embodiment of the present disclosure, as illustrated in FIG. 10. In other words, the first diode D1 has the cathode thereof connected to the first terminal 14 side, and the anode thereof connected to the gate terminal 131 side. With such a configuration, the combined resistance upon turning off results in being smaller than the combined resistance upon turning on.

Third Embodiment

Figure 11:
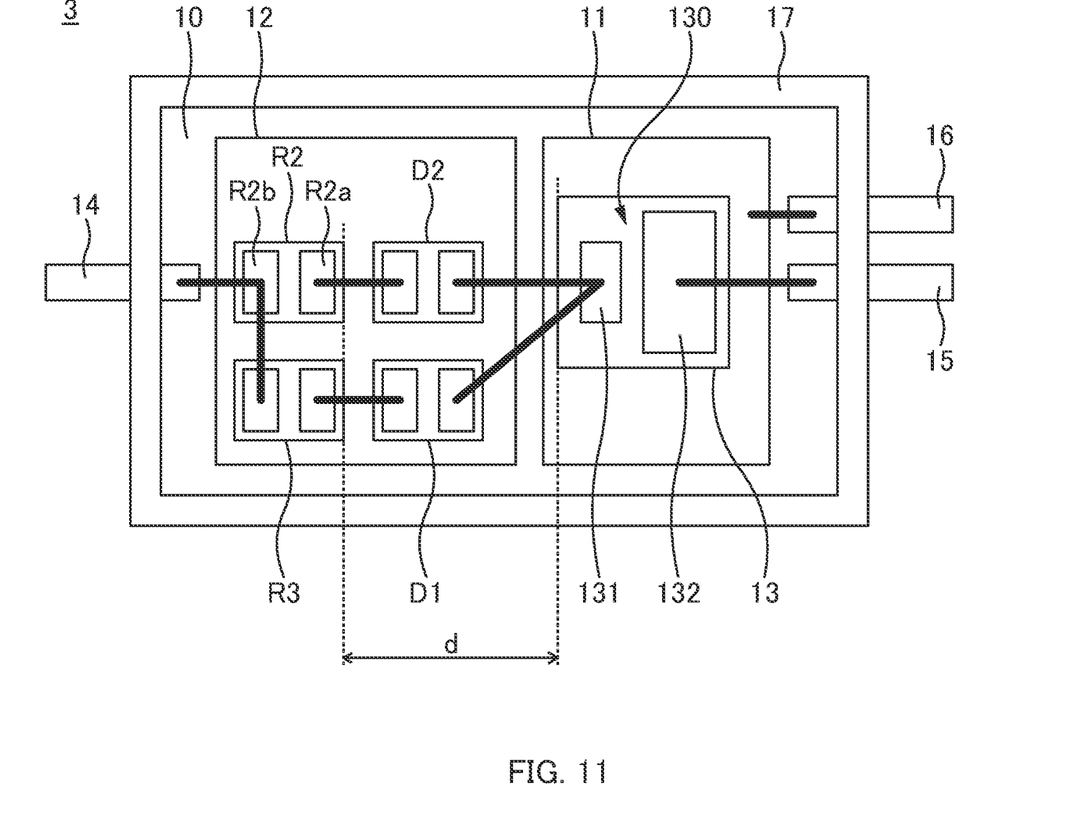
FIG. 11 is a diagram illustrating one example of a configuration of a semiconductor module 3.
Figure 12:
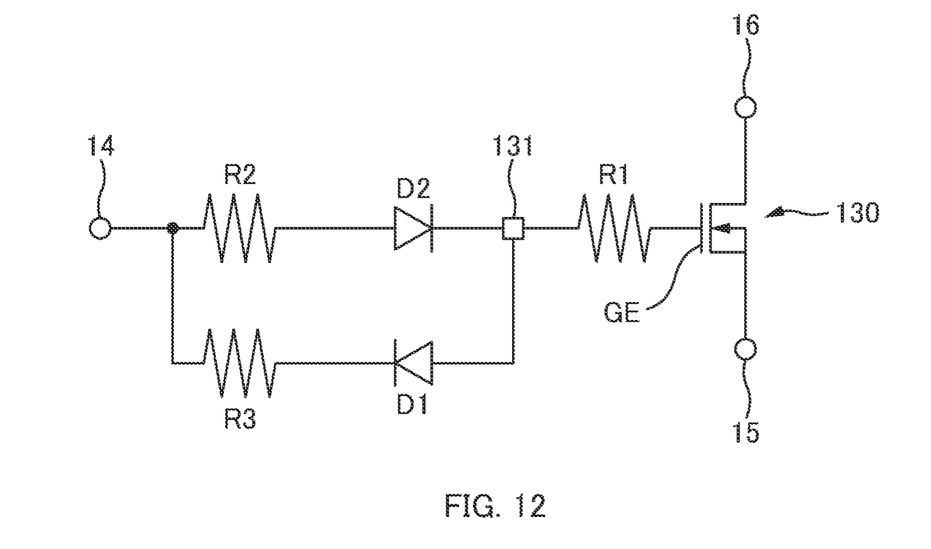
FIG. 12 is a diagram illustrating an equivalent circuit of a semiconductor module 3.

FIG. 11 a diagram illustrating one example of a configuration of a semiconductor module 3 according to an embodiment of the present disclosure. FIG. 12 is a diagram illustrating an equivalent circuit of the semiconductor module 3. The semiconductor module 3 is different from the semiconductor module 2 according to the second embodiment, in further comprising a second diode D2. Note that, in FIGS. 11 and 12, the reference numerals of elements and the like other than the second diode D2 are the same as those in FIGS. 8 and 9.

The second diode D2 is mounted on the second conductive pattern 12. The second diode D2 is mounted between the gate terminal 131 and the first terminal 14, and is connected in series with the second resistance R2, as well as connected in antiparallel to the first diode D1. More specifically, the gate terminal 131, the second diode D2, the second resistance R2, and the first terminal 14 are connected in this order. Further, the semiconductor chip 13 in which the first resistance R1 is formed and the second and third resistances R2, R3 are spaced apart from each other by the predetermined distance d.

This makes it possible to easily set each of the combined resistance upon turning on and the combined resistance upon turning off to a desired value. Specifically, the combined resistance upon turning on results in the resistance value of the second resistance R2. The combined resistance upon turning off results in the resistance value of the third resistance R3.

==Summary==

As has been described, the semiconductor modules 1, 2, 3 respectively according the first to third embodiments each comprise: the semiconductor chip 13 that includes the switching device 130 having a control electrode, and a control terminal connected to the control electrode, the first resistance R1 being a resistance between the control electrode and the control terminal, the first resistance R1 having a positive temperature coefficient; and the second resistance R2 connected to the control terminal, the second resistance R2 having a negative temperature coefficient, wherein the temperature coefficient of the combined resistance of a resistance connected to the control terminal is zero or negative.

This reduces the resistance value of the combined resistance of the resistance connected to the control terminal with a rise in temperature. Thus, the switching loss of the switching device 130 can be reduced.

Further, in each of the semiconductor modules 1, 2, 3 respectively according the first to third embodiments, the temperature coefficient of the combined resistance is zero or negative at least within the operating ranges of the semiconductor modules 1, 2, and 3. This can reduce the switching loss of the switching device 130 within the operating ranges of the semiconductor modules 1, 2, and 3.

Further, the semiconductor modules 2, 3 respectively according to the second and third embodiments each further comprise: the third resistance R3 that is mounted between the control electrode connected with one end of the second resistance R2 and the first terminal 14 connected to the other end of the second resistance R2, is connected in parallel with the second resistance, and has a negative temperature coefficient; and the first diode D1 that is mounted between the control terminal and the other end of the second resistance R2, and is connected in series with the third resistance R3.

This causes the combined resistance upon turning on to be smaller than the combined resistance upon turning off. This can increase the switching speed upon turning on. In addition, even if the resistance values of the second resistance R2 and the third resistance R3 decrease with a rise in temperature, no current flows through the second resistance R2 upon turning off, and thus a surge voltage upon turning off can be reduced.

Further, the semiconductor module 3 according to the third embodiment further comprises the second diode D2 that is mounted between the control terminal and the first terminal 14 connected with the other end of the second resistance R2, is connected in series with the second resistance R2, as well as is connected in antiparallel to the first diode D1.

This makes it possible to easily set each of the combined resistance upon turning on and the combined resistance upon turning off to a desired value.

Further, the semiconductor modules 1, 2, 3 respectively according the first to third embodiments each further comprise: the first conductive pattern 11 to which the semiconductor chip 13 is mounted, and the second conductive pattern 12 to which the second and third resistances R2, R3 and the first diode D1 are mounted.

This makes it possible that the temperature of the elements mounted to the second conductive pattern 12 is substantially constant.

Further, the semiconductor module 3 according to the third embodiment further comprises: the first conductive pattern 11 to which the semiconductor chip 13 is mounted; and the second conductive pattern 12 to which the second and third resistances R2, R3 and the first and second diodes D1, D2 are mounted.

This makes it possible that the temperature of the elements mounted to the second conductive pattern 12 is substantially constant.

Further, in each of the semiconductor modules 1, 2, 3 respectively according the first to third embodiments, the second resistance R2 is spaced apart from the semiconductor chip 13 by a predetermined distance, such that the temperature of the second resistance R2 start to rise after the predetermined time period $t_a$ has elapsed since the temperature of the semiconductor chip 13 starts to rise.

Further, in each of the semiconductor modules 2, 3 respectively according to the second and third embodiments, the second and third resistances R2, R3 are spaced apart from the semiconductor chip 13 by a predetermined distance such that the temperature of the second and third resistances R2, R3 starts to rise after a predetermined time period $t_a$ has elapsed since the temperature of the semiconductor chip 13 starts to rise.

Further, in each of the semiconductor modules 1, 2, 3 respectively according the first to third embodiments, the predetermined time period $t_a$ is 1 second or more and 120 seconds or less. This can mitigate the oscillation phenomenon that occurs upon the transition of the operation state and/or a sudden change of the load condition to the light load condition, as well as reduce the switching loss.

Further, in each of the semiconductor modules 1, 2, 3 respectively according the first to third embodiments, the predetermined distance is 0.5 mm or more and 60 mm or less. This can mitigate the oscillation phenomenon that occurs upon the transition of the operation state and/or a sudden change of the load condition to the light load condition, as well as reduce the switching loss.

Further, in each of the semiconductor modules 1, 2, 3 respectively according the first to third embodiments, the switching device 130 is an IGBT or a MOS transistor.

Further, in each of the semiconductor modules 1, 2, 3 respectively according the first to third embodiments, the semiconductor chip 13 is a chip using a Si substrate, a SiC substrate, or a GaN substrate.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

According to the present disclosure, it is possible to provide a semiconductor module capable of reducing the switching loss of a semiconductor switching device.

What is claimed is:
1. A semiconductor module comprising:
   a semiconductor chip that includes a switching device having
     a control electrode, and
     a control terminal connected to the control electrode,
   a first resistance being formed between the control electrode and the control terminal, the first resistance having a positive temperature coefficient; and
   a second resistance connected to the control terminal, the second resistance having a negative temperature coefficient, wherein
   a temperature coefficient of a combined resistance at the control terminal is zero or negative, wherein
   the second resistance is spaced apart from the semiconductor chip by a predetermined distance, such that a temperature of the second resistance starts to rise after a predetermined time period has elapsed since a temperature of the semiconductor chip starts to rise.
2. The semiconductor module according to claim 1, wherein
   the temperature coefficient of the combined resistance is zero or negative at least within a temperature range in which the semiconductor module operates.
3. A semiconductor module comprising:
   a semiconductor chip that includes a switching device having
     a control electrode, and
     a control terminal connected to the control electrode,
   a first resistance being formed between the control electrode and the control terminal, the first resistance having a positive temperature coefficient;
   a second resistance connected to the control terminal, the second resistance having a negative temperature coefficient;
   a third resistance connected in parallel with the second resistance, the third resistance having a negative temperature coefficient; and
   a first diode connected in series with the third resistance, wherein a temperature coefficient of a combined resistance at the control terminal is zero or negative.

4. The semiconductor module according to claim 3, further comprising:
a second diode connected in series with the second resistance, the second diode being in antiparallel to the first diode.

5. The semiconductor module according to claim 4, further comprising:
a first conductive pattern to which the semiconductor chip is mounted; and
a second conductive pattern to which the second and third resistances and the first and second diodes are mounted.

6. The semiconductor module according to claim 3, further comprising:
a first conductive pattern to which the semiconductor chip is mounted; and
a second conductive pattern to which the second and third resistances and the first diode are mounted.

7. The semiconductor module according to claim 6, wherein
the second and third resistances are spaced apart from the semiconductor chip by a predetermined distance, such that temperatures of the second and third resistances start to rise after a predetermined time period has elapsed since a temperature of the semiconductor chip starts to rise.

8. The semiconductor module according to claim 1, wherein
the predetermined time period is 1 second or more and 120 seconds or less.

9. The semiconductor module according to claim 1, wherein
the predetermined distance is 0.5 mm or more and 60 mm or less.

10. The semiconductor module according to claim 1, wherein
the switching device is an insulated gate bipolar transistor (IGBT) or a metal-oxide-semiconductor (MOS) transistor.

11. The semiconductor module according to claim 1, wherein
the semiconductor chip is a chip using a Si substrate, a SiC substrate, or a GaN substrate.

12. The semiconductor module according to claim 1, wherein a resistance value of the combined resistance at the control terminal is a sum of resistance values of the first and second resistances.

* * * * *